(12) United States Patent
Nomoto

(10) Patent No.: US 7,352,437 B2
(45) Date of Patent: Apr. 1, 2008

(54) EXPOSURE APPARATUS

(75) Inventor: Makoto Nomoto, Utsunomiya (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 11/275,953

(22) Filed: Feb. 7, 2006

(65) Prior Publication Data

US 2006/0176455 A1 Aug. 10, 2006

(30) Foreign Application Priority Data

Feb. 8, 2005 (JP) .............................. 2005-032357

(51) Int. Cl.
*G03B 27/42* (2006.01)
*G03B 27/52* (2006.01)
(52) U.S. Cl. ......................................... 355/53; 355/30
(58) Field of Classification Search ................. 355/53, 355/72, 30, 67, 55
See application file for complete search history.

(56) References Cited

U.S. PATENT DOCUMENTS

| 6,987,554 | B2 | 1/2006 | Nomoto ........................ 355/53 |
| 2005/0046813 | A1* | 3/2005 | Streefkerk et al. ............ 355/30 |
| 2005/0110968 | A1 | 5/2005 | Aichi et al. .................... 355/30 |
| 2005/0179877 | A1* | 8/2005 | Mulkens et al. .............. 355/30 |
| 2005/0243293 | A1* | 11/2005 | Hara et al. ..................... 355/53 |
| 2006/0050257 | A1* | 3/2006 | Honda ........................... 355/67 |
| 2006/0114445 | A1* | 6/2006 | Ebihara ......................... 355/72 |
| 2006/0176455 | A1 | 8/2006 | Nomoto ........................ 355/53 |

FOREIGN PATENT DOCUMENTS

JP          6-124873          5/1994

* cited by examiner

*Primary Examiner*—Peter B. Kim
(74) *Attorney, Agent, or Firm*—Fitzpatrick, Cella, Harper & Scinto

(57) ABSTRACT

An exposure apparatus configured to expose a substrate to light via a reticle. The apparatus includes a projection optical system configured to project a pattern of the reticle onto the substrate, a nozzle configured to supply liquid to a region between the projection optical system and the substrate where the light passes, and a circulation system configured to circulate liquid to be supplied to the nozzle. The circulation system includes (i) a tank configured to store an externally supplied liquid, (ii) a first flow path configured to supply liquid from the tank to the nozzle, (iii) a thermoregulator configured to thermoregulate a temperature of liquid in the first flow path, and (iv) a second flow path configured to supply liquid to the tank from a branched point of the first flow path between the nozzle and the thermoregulator.

12 Claims, 8 Drawing Sheets

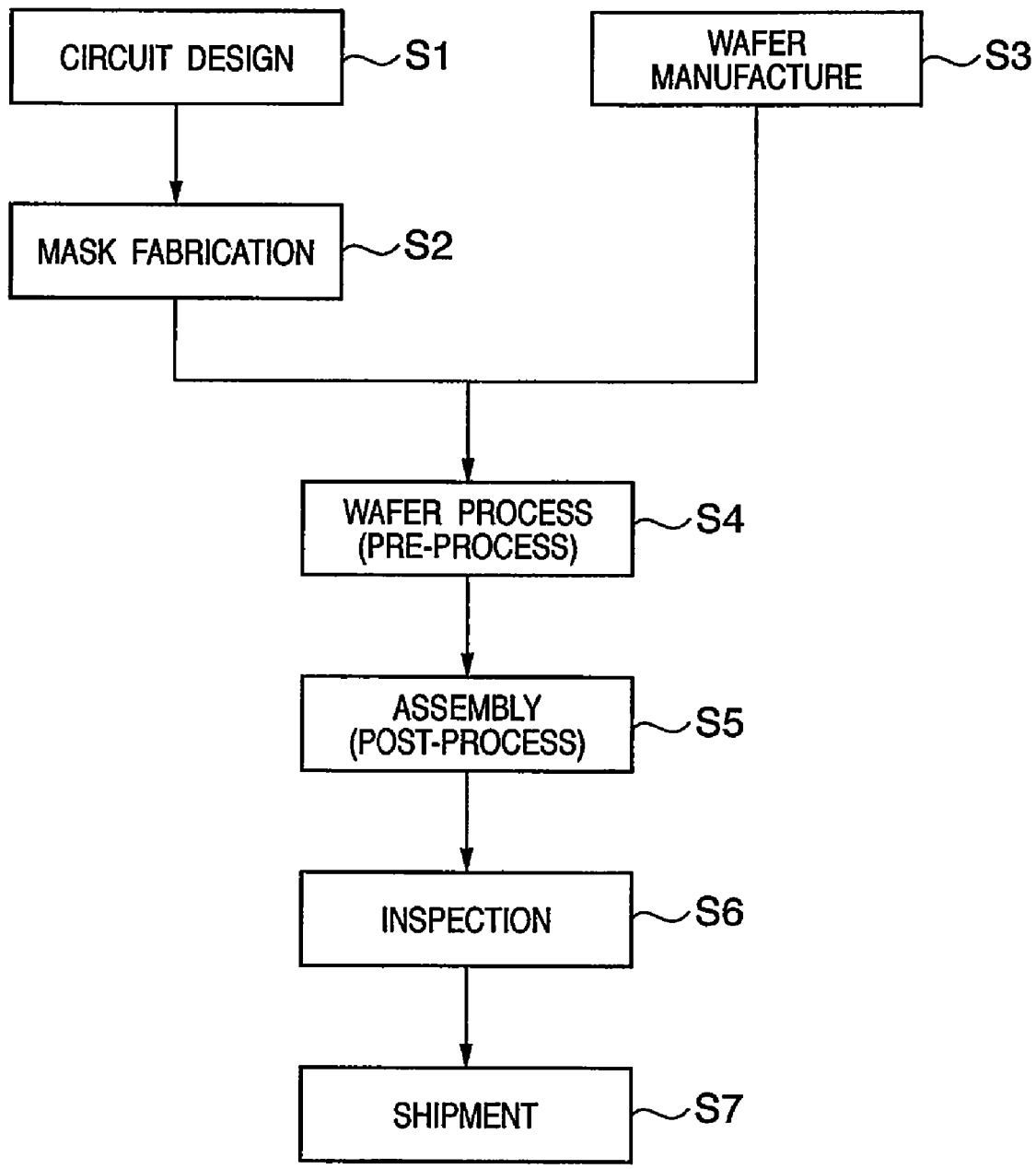
F I G. 7

EXPOSURE APPARATUS

FIELD OF THE INVENTION

The present invention relates to an exposure apparatus used in semiconductor manufacture, and the like, and, more particularly, to an exposure apparatus for exposing a substrate to light while a region, between a projection optical system and the substrate where the light passes, is filled with liquid.

BACKGROUND OF THE INVENTION

FIG. 5 shows the schematic structure of a conventional exposure apparatus. Reference numeral 31 denotes a light source of the exposure apparatus used in the semiconductor manufacture, and the like. For further miniaturization of exposure patterns, the light source 31 tends to use light having a shorter wavelength. The light source 31 has advanced from an i-line source to an excimer laser. The laser light source has further advanced from a KrF excimer laser to an ArF excimer laser. At present, in order to satisfy a demand for further micropatterning, it is proposed to use an $F_2$ laser or an EUV light source.

Light emitted from the light source 31 is guided to an illumination optical system 33 through an introduction port 32. The illumination optical system 33 removes an illumination variation and shapes the beam. Then, the resultant beam is applied, as illumination light, to a reticle 34 as an original of an exposure pattern. The reticle 34 is placed on a reticle stage 35.

The light transmitted through the reticle 34 serves as pattern light to reduce and to project a pattern onto a wafer 37 arranged in a plane optically conjugate to that of the reticle 34 through a projection optical system 36.

The wafer 37 is placed on a wafer stage 38 driven by a linear motor, and undergoes step and repeat overlay exposure. Along with the necessity of a smaller integrated circuit line width, there has been developed the following semiconductor exposure apparatus. That is, the apparatus narrows down an exposure area to a slit at the central portion of the projection optical system 36, at which optimal imaging is possible. Then, the apparatus also drives the reticle stage 35 by a linear motor to expose the wafer while synchronously scanning the wafer stage 38 and reticle stage 35.

In recent years, a liquid immersion exposure apparatus has received a great deal of attention, which executes exposure while filling, with a liquid such as pure water, an exposure light transmission space (also to be referred to as a liquid immersion portion or a liquid immersion region hereinafter) between the wafer 37 and the lowermost surface of the projection optical system 36. By adopting such liquid immersion, a high numerical aperture (NA) can be attained owing to a high refractive index of a liquid. This amounts to grasping a chance to easily realize further micropatterning by adding a liquid immersion apparatus to an existing ArF exposure apparatus as a base without any $F_2$ laser or EUV light source, which applies a large installation load (see, e.g., Japanese Patent Laid Open No. 6-124873).

FIG. 6 is a view showing an example of the form of a liquid immersion exposure apparatus. FIG. 6 shows an arrangement in the case of local liquid immersion. In liquid immersion exposure, a liquid immersion region is formed to be partitioned by a liquid immersion wall 21 on the lowermost surface of the projection optical system 36. A liquid supply nozzle 22 and liquid recovery nozzle 23 are arranged to face the liquid immersion region. Liquid immersion exposure is based on the following method. That is, the liquid supply nozzle 22 supplies a predetermined amount of a liquid immersion fluid in synchronism with recovery by the liquid recovery nozzle 23. With this operation, exposure is executed in the liquid immersed state, in which the liquid immersion region is filled with a liquid immersion fluid.

Since a liquid used for liquid immersion (also to be referred to as a liquid immersion fluid hereinafter) is regarded as even part of an optical device, it is demanded to strictly control purity, flow rate, and temperature. Ultra pure water is generally used as the liquid immersion fluid. Ultra pure water produced from factory equipment is thermoregulated by a cooler 24, heater 25, temperature sensor 26, and thermoregulator 27 through a supply line 28 with a supply valve 30, and supplied to a liquid immersion region through the liquid supply nozzle 22.

When ultra pure water is to be used as the liquid immersion fluid, in order to avoid mixing of impurities, such as particles or ions, the material of a liquid contact portion is limited to Teflon® based and glass based materials, and resins such as vinyl chloride, and metal based materials cannot be used. This naturally applies to the materials of the cooler 24, heater 25, and temperature sensor 26 having liquid contact portions, which contact the liquid immersion fluid.

Unfortunately, when a material such as Teflon (trademark) is used for a device which thermoregulates the liquid immersion fluid, its heat transfer characteristic worsens. In particular, assume that ultra pure water is provided from factory equipment under the condition in which its flow rate and temperature are largely varied. In this case, the liquid immersion fluid is supplied to a liquid immersion region while disturbances are not completely eliminated, due to a bad response characteristic of the thermoregulation system. Accordingly, there is a possibility that the imaging performance of liquid immersion exposure is decisively damaged.

Moreover, since a follow up characteristic with respect to a heat capacity variation at the start of the supply degrades, the operator must wait until the temperature stabilizes, resulting in a decrease in throughput.

SUMMARY OF THE INVENTION

The present invention has been made in consideration of the above background, and has as its object to provide an exposure apparatus which realizes high accuracy in thermoregulation of immersion liquid, and high throughput.

In order to solve the above problem and to achieve the object, according to an aspect of the present invention, there is provided an exposure apparatus for exposing a substrate to light via a reticle, the apparatus comprising a projection optical system configured to project a pattern of the reticle onto the substrate, a nozzle configured to supply liquid to a region between the projection optical system and the substrate where the light passes, a circulation system configured to circulate liquid to be supplied to the nozzle, and a first thermoregulator configured to thermoregulate liquid in the circulation system.

In the above aspect, the circulation system includes a tank configured to store an externally supplied liquid.

In the above aspect, the circulation system further includes a first flow path configured to come from the tank and return to the tank.

In the above aspect, the first thermoregulator includes a heat exchanger configured to exchange heat with the liquid.

In the above aspect, the apparatus further comprises a detector configured to detect an amount of liquid in the tank, and a first flow regulator configured to regulate a flow rate of liquid externally supplied to the tank based on a detection performed by the detector.

In the above aspect, the apparatus further comprises a valve configured to supply liquid from the circulation system to the nozzle.

In the above aspect, the circulation system includes a second flow regulator configured to regulate a flow rate of liquid refluxed to the tank.

In the above aspect, the apparatus further comprises a second flow path arranged between the valve and the nozzle, and a third flow regulator configured to regulate a flow rate of liquid in the second flow path.

In the above aspect, the apparatus further comprises a second flow path arranged between the valve and the nozzle, and a gas supply system configured to supply gas into the second flow path.

In the above aspect, the circulation system includes at least one of an ion exchanger configured to remove an ion dissolved in a liquid, a degasifier configured to degasify liquid, and a sterilizer configured to sterilize liquid.

In the above aspect, a flow path of the circulation system has a portion configured to exchange heat with the projection optical system.

In the above aspect, the first thermoregulator includes a heater configured to heat liquid downstream of the heat exchanger.

In the above aspect, the apparatus further comprises a second thermoregulator configured to thermoregulate liquid externally supplied to the tank.

According to another aspect of the present invention, there is proposed a method of manufacturing a device, the method comprising steps of exposing a substrate to light via a reticle using an exposure apparatus as defined in any one of the above aspects, developing the exposed substrate, and processing the developed substrate to manufacture the device.

The present invention can provide an exposure apparatus which realizes high liquid immersion fluid thermoregulation accuracy and throughput.

Other objects and advantages besides those discussed above shall be apparent to those skilled in the art from the description of a preferred embodiment of the invention, which follows. In the description, reference is made to the accompanying drawings, which form a part thereof, and which illustrate an example of the invention. Such an example, however, is not exhaustive of the various embodiments of the invention, and, therefore, reference is made to the claims which follow the description for determining the scope of the invention.

BRIEF DESCRIPTION OF THE DRAWINGS

FIG. 7 is a flowchart showing a device manufacturing method; and

DETAILED DESCRIPTION OF THE PREFERRED EMBODIMENTS

Embodiments of the present invention will be described below in detail with reference to the accompanying drawings.

Note that the embodiments to be described hereinafter are merely examples as implementation means of the present invention, and should be appropriately modified or changed in accordance with various conditions and the structure of an apparatus to which the present invention is applied. For example, the present invention is not limited to the embodiments to be described hereinafter, and incorporates an arrangement obtained by combining the feature points of at least two of the second to fourth embodiments.

First Embodiment

Figure 1:
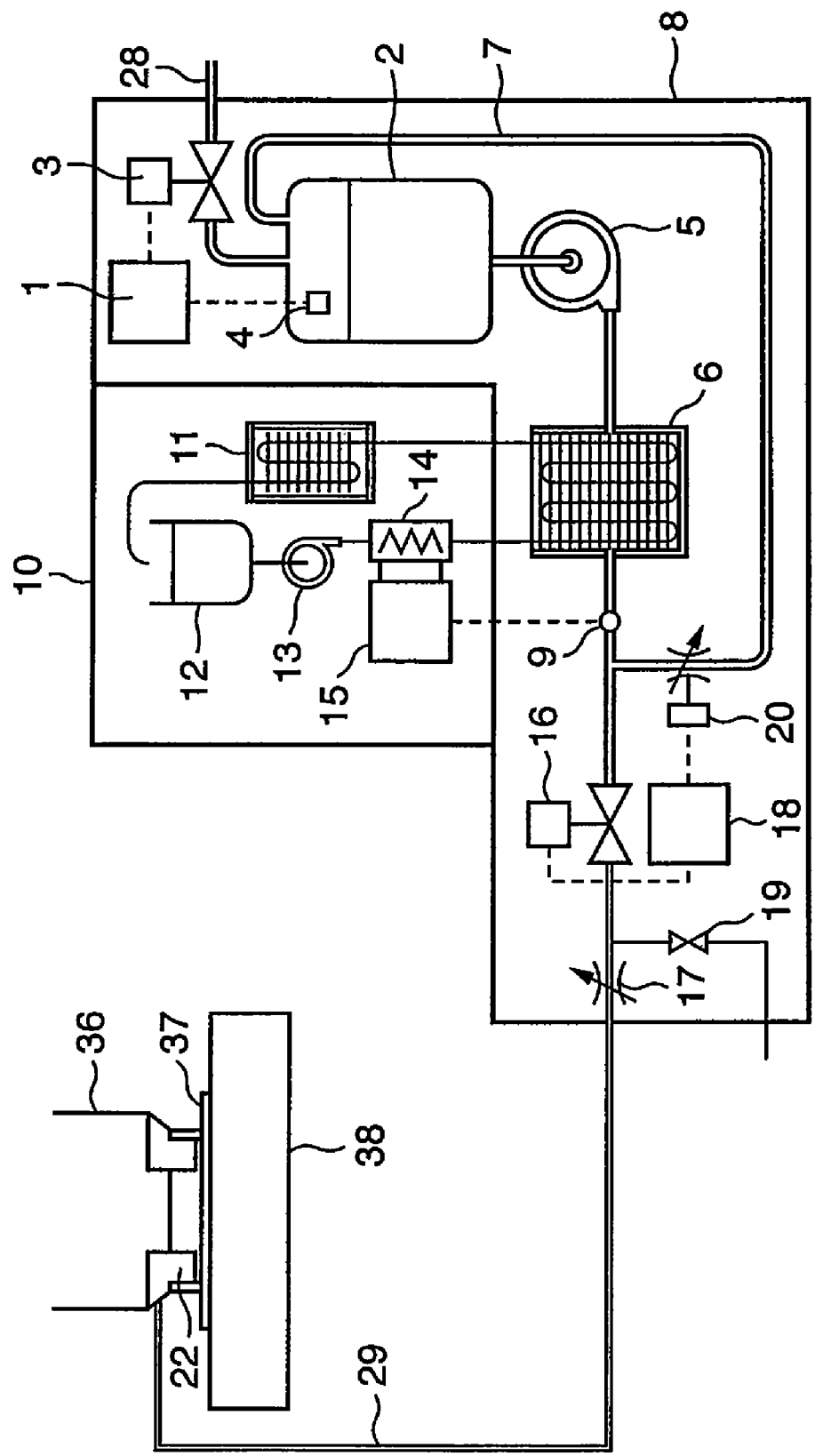
FIG. 1 is a view showing a liquid immersion fluid supply system of an exposure apparatus according to the first preferred embodiment of the present invention.
Figure 5:
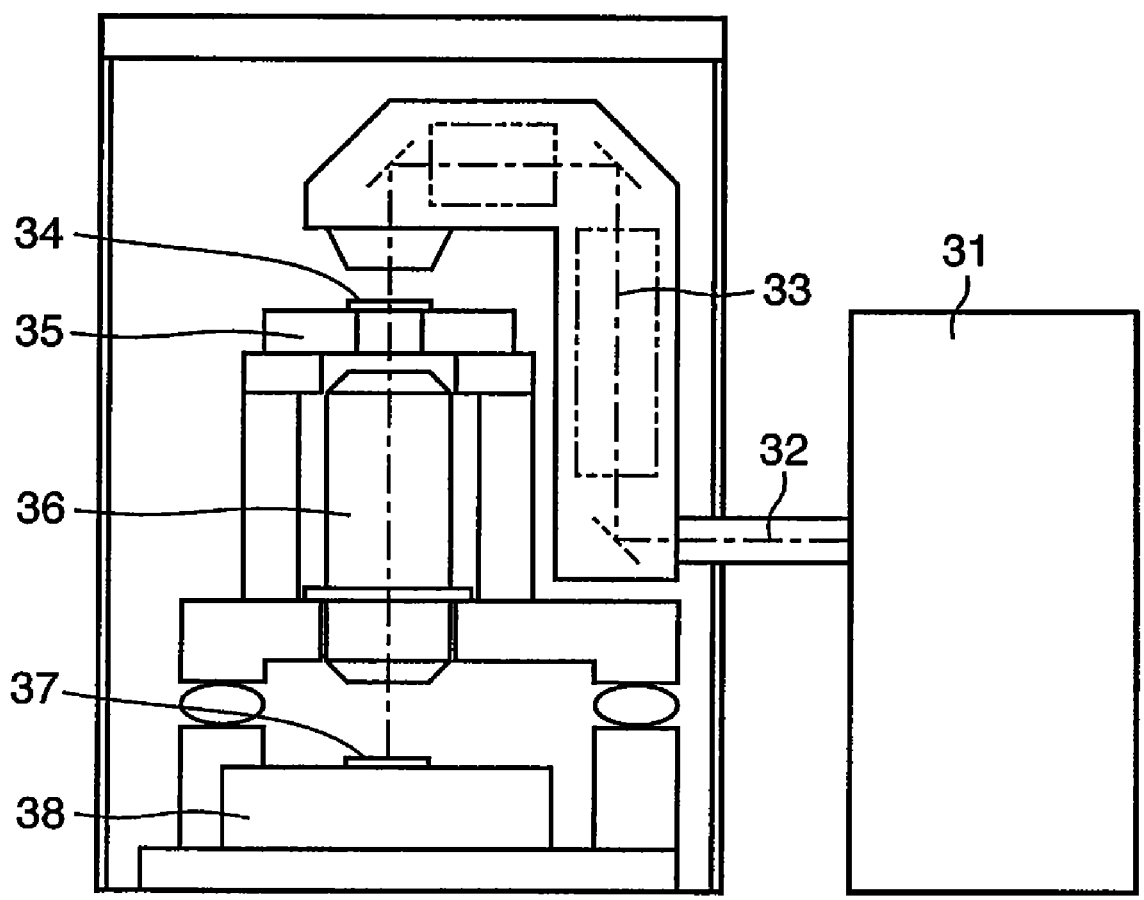
FIG. 5 is a view showing a conventional exposure apparatus.
Figure 6:
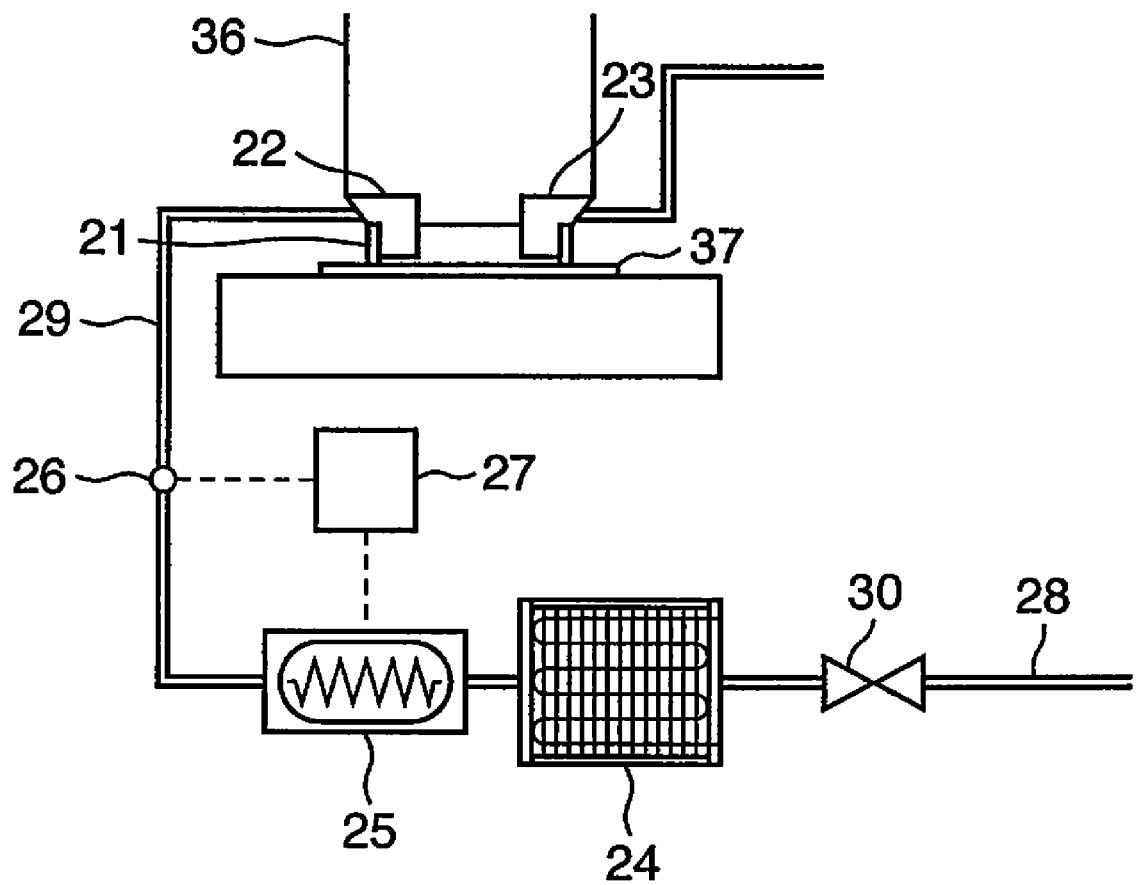
FIG. 6 is a view showing a liquid immersion fluid supply system of the conventional exposure apparatus.

FIG. 1 is a view showing a liquid immersion fluid supply system of an exposure apparatus according to the first preferred embodiment of the present invention. Constituent elements common to those shown in FIG. 5 are denoted by the same reference numerals.

The liquid immersion fluid supply system according to this embodiment is roughly divided into an immersion liquid thermoregulation and circulation system 8 and a thermoregulation fluid circulation system 10 used for a fluid other than a liquid immersion fluid.

A liquid immersion fluid provided from factory equipment (not shown) is first supplied from a supply line 28 of the immersion liquid thermoregulation and circulation system 8. When an immersion liquid flow rate controller 1 controls the flow rate of the liquid immersion fluid, it is supplied to a heat insulated tank 2. The immersion liquid flow rate controller 1 has a shutoff valve 3 arranged between the heat insulated tank 2 and supply line 28 and a liquid level sensor 4 arranged in the heat insulated tank 2. The immersion liquid flow rate controller 1 provides control to open/close the shutoff valve 3 such that the liquid level in the heat insulated tank 2 always falls within a predetermined range. The flow rate of the liquid immersion fluid supplied to the heat insulated tank 2 is controlled to be equal to or more than that of a liquid immersion fluid supplied to a liquid immersion portion of the exposure apparatus.

The heat insulated tank 2 is prepared to eliminate (absorb) disturbances such as a flow rate variation, pressure variation, and temperature variation of a liquid immersion fluid provided from the factory equipment. For a maximum flow rate and maximum temperature difference of a fluid to be supplied, the heat insulated tank 2 must have a capacity sufficient enough to store a liquid immersion fluid for at least a heat capacity corresponding to an allowable temperature variation of the liquid immersion portion. In other words, allowable values of the flow rate and temperature of a liquid immersion fluid to be supplied to the heat insulated tank 2 are determined on the basis of an allowable temperature variation of the liquid immersion portion and the tank capacity.

The heat-insulated tank 2 has a heat insulated structure to suppress the influence of heat disturbances directly applied to the tank itself on a liquid immersion fluid. A thermoregulation system (not shown) is more preferably prepared to control the heat-insulated tank 2 to a predetermined temperature.

A pump 5 and heat exchanger 6 are arranged in a downstream line of the heat-insulated tank 2 in the immersion liquid thermoregulation and circulation system 8. A recovery pipe 7, which branches from a line connected to the liquid immersion portion to reflux a liquid immersion fluid to the heat insulated-tank 2 is arranged in a downstream line of the heat exchanger 6. As a characteristic feature of this embodiment, the recovery pipe 7, which branches to reflux the fluid to the heat-insulated tank 2, is arranged in the downstream line of the heat exchanger 6 in the immersion liquid thermoregulation and circulation system 8. Note that the flow rate of a liquid immersion fluid from the pump 5 is controlled to be equal to or more than that of a fluid required to be supplied to the liquid immersion portion.

Moreover, a temperature sensor 9 is arranged upstream of the recovery pipe 7 in the downstream line of the heat exchanger 6 so as to control the temperature of a liquid immersion fluid to be detected by the temperature sensor 9 to a predetermined temperature.

A temperature control method of a liquid immersion fluid will be described next in addition to a description of the thermoregulation fluid circulation system 10.

The thermoregulation fluid circulation system 10 has a cooler 11, tank 12, pump 13, and heater 14. A temperature-regulation fluid other than a liquid immersion fluid is supplied to the heat exchanger 6 in the immersion liquid thermoregulation and circulation system 8 to exchange heat with the liquid immersion fluid. At this time, the temperature sensor 9 outputs a detection signal to a thermoregulator 15. The thermoregulator 15 then outputs a signal to the heater 14, thereby controlling the temperature of the thermoregulation fluid, such that the liquid immersion fluid of the temperature sensor 9 becomes a predetermined temperature.

When ultra pure water (e.g., having a resistivity of 17.8 MΩcm or more and inorganic ions of 0.01 ppb or less) is adopted as the liquid immersion fluid, a liquid contact portion of the heat exchanger 6 is preferably made of a material such as Teflon (trademark), glass, or vinyl chloride. To the contrary, a thermoregulator made of a metal having a good heat transfer characteristic is adopted for the thermoregulation fluid, thereby improving a response characteristic. The heat exchanger 6 naturally insulates the liquid immersion fluid and thermoregulation fluid except for heat. Hence, the liquid contact portion of the thermoregulation fluid can be made of a metal without posing any problem. However, since a slight amount of a fluid permeates, the thermoregulation fluid is preferably pure water to reduce the permeation phenomenon.

A nozzle supply controller 18 having a supply valve 16 and flow rate regulating valve 17 is arranged in a downstream line of the temperature sensor 9 in the immersion liquid thermoregulation and circulation system 8. A nozzle supply pipe 29 extends from the supply valve 16 to the downstream side to communicate with a liquid supply nozzle 22. A liquid immersion fluid is supplied to the liquid immersion region by opening the supply valve 16 of the nozzle supply controller 18. At this time, the flow rate regulating valve 17 regulates the liquid immersion fluid to a predetermined flow rate. If the flow rate of a fluid refluxed from the recovery pipe 7 to the heat-insulated tank 2 is higher than that of a fluid supplied to the nozzle 22, a flow rate variation at the start of the supply can be reduced. This makes it possible to reduce a temperature variation caused by the heat exchanger 6. Moreover, a recovery flow rate regulating valve 20 may be prepared for the recovery pipe 7 to control the flow rate of a fluid in the recovery pipe 7 such that the flow rate of a liquid immersion fluid which passes through the heat exchanger 6 does not vary during the opening and closing of the supply valve 16.

When liquid immersion exposure is to be stopped, supply of a liquid immersion fluid to the liquid immersion region is stopped by closing the supply valve 16 in the nozzle supply controller 18. However, a liquid immersion fluid remains in the nozzle supply pipe 29. When the residual fluid is left, it corrodes and loses a desired purity, so the next start of liquid immersion exposure is interfered with. To solve this problem, a valve 19 is arranged to be close to the downstream side of the supply valve 16 to recover the liquid immersion fluid in the nozzle supply pipe 29 at the stop of liquid immersion fluid supply and to implant an inert gas into the pipe. This makes it possible to replace the residual fluid in the pipe between the supply valve 16 and the liquid supply nozzle 22 with an inert gas.

According to this embodiment, the immersion liquid thermoregulation and circulation system 8 can eliminate disturbances such as a temperature variation and flow rate variation of a liquid immersion fluid provided from the factory equipment, and a capacity variation at the start of supply. Moreover, even an ultra pure water thermoregulator configured to have a poor heat transfer characteristic implements high stability in temperature and flow rate, thus supplying a liquid immersion fluid to the liquid immersion portion at a high speed.

Also, at the stop of liquid immersion fluid supply, the influence of corrosion can be prevented, because no liquid immersion fluid remains in the pipe.

Second Embodiment

Figure 2:
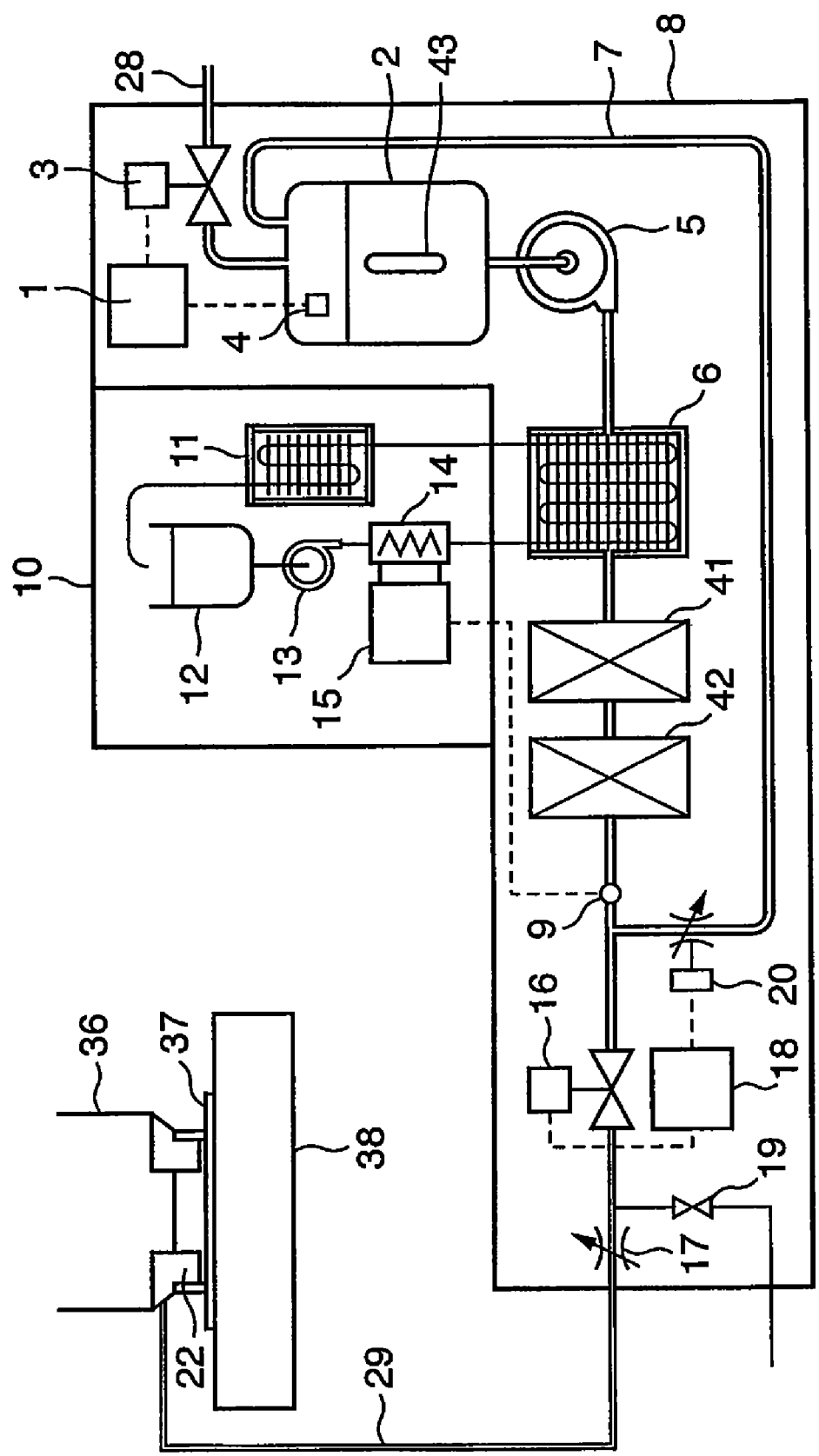
FIG. 2 is a view showing a liquid immersion fluid supply system of an exposure apparatus according to the second preferred embodiment of the present invention.

FIG. 2 is a view showing a liquid immersion fluid supply system of an exposure apparatus according to the second preferred embodiment of the present invention. Constituent elements common to those in the first embodiment in FIG. 1 are denoted by the same reference numerals.

As a characteristic feature of the second embodiment, an ultra pure water generation/maintenance function is newly prepared for the immersion liquid thermoregulation and circulation system 8 of the first embodiment.

More specifically, to add an ultra pure water generation function, an ion exchange membrane 41 to remove ions dissolved in a liquid immersion fluid is arranged in a downstream line (upstream of a recovery pipe 7) of a heat exchanger 6. With this structure, even if the purity of pure water provided from factory equipment is somewhat low, ultra pure water with high purity can be provided. Moreover, when a degasifying or degassing membrane 42 to remove air bubbles in the liquid immersion fluid is arranged downstream of the ion exchange membrane 41, the generation rate of microorganisms can be reduced, and the generation of air bubbles can be suppressed. This contributes to the prevention of degradation in image performance due to bubbles, such as micro bubbles, in liquid immersion exposure. Moreover, when a UV lamp 43 is arranged in a heat insulated tank 2 of an immersion liquid thermoregulation and circulation system 8, it is possible to suppress the generation of microorganisms by sterilizing the microorganisms in the liquid immersion fluid using ultraviolet rays.

According to this embodiment, even if pure water provided from factory equipment is unsuitable for liquid immersion exposure, ultra pure water for liquid immersion exposure can be generated and maintained by preparing an ultra pure water generation function, degasifying or degassing function, and sterilization function. This makes it possible to provide a liquid immersion exposure apparatus which does not apply a large load to the factory equipment.

Third Embodiment

Figure 3:
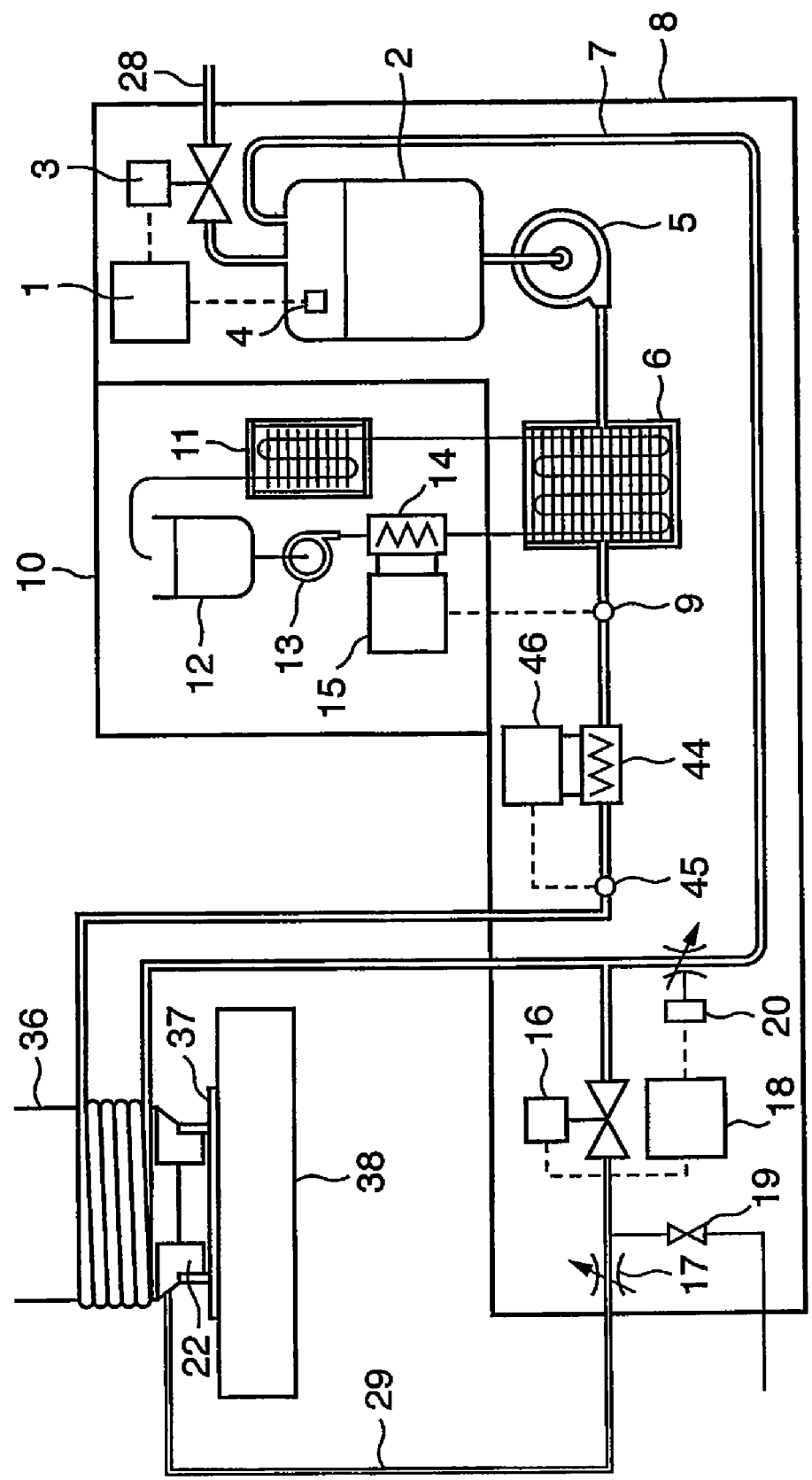
FIG. 3 is a view showing a liquid immersion fluid supply system of an exposure apparatus according to the third preferred embodiment of the present invention.

FIG. 3 is a view showing a liquid immersion fluid supply system of an exposure apparatus according to the third preferred embodiment of the present invention. Constituent elements common to those in the first embodiment in FIG. 1 are denoted by the same reference numerals.

As a characteristic feature of the third embodiment, a precision thermoregulation means is newly prepared for the immersion liquid thermoregulation and circulation system 8 of the first embodiment.

More specifically, a heater 44 which can execute precise thermoregulation is arranged in a downstream line of a heat exchanger 6, thus further improving the thermoregulation accuracy. A temperature sensor 45 arranged downstream of the heater 44 outputs a detection signal to a thermoregulator 46. The thermoregulator 46 then outputs a signal to the heater 44, thereby controlling the temperature of the liquid immersion fluid such that a liquid immersion fluid in the temperature sensor 45 becomes a predetermined temperature. Moreover, when a downstream line of the temperature sensor 45 is wound around an external cylinder, or the like, of a projection optical system 36, a thermoregulated immersion liquid can be supplied to the projection optical system 36 to set the temperature of the liquid immersion fluid to be almost equal to that of the projection optical system 36. This makes it possible to realize a thermoregulation system having excellent temperature stability. Also, the temperature sensor 45 is more preferably arranged near the projection optical system 36.

According to this embodiment, the temperature stability is improved by precise thermoregulation and the temperatures of a liquid immersion fluid and projection optical system are made uniform. This makes it possible to provide an exposure apparatus which can prevent degradation in image performance by a temperature variation and to supply a liquid immersion fluid having a constantly stable temperature.

Fourth Embodiment

Figure 4:
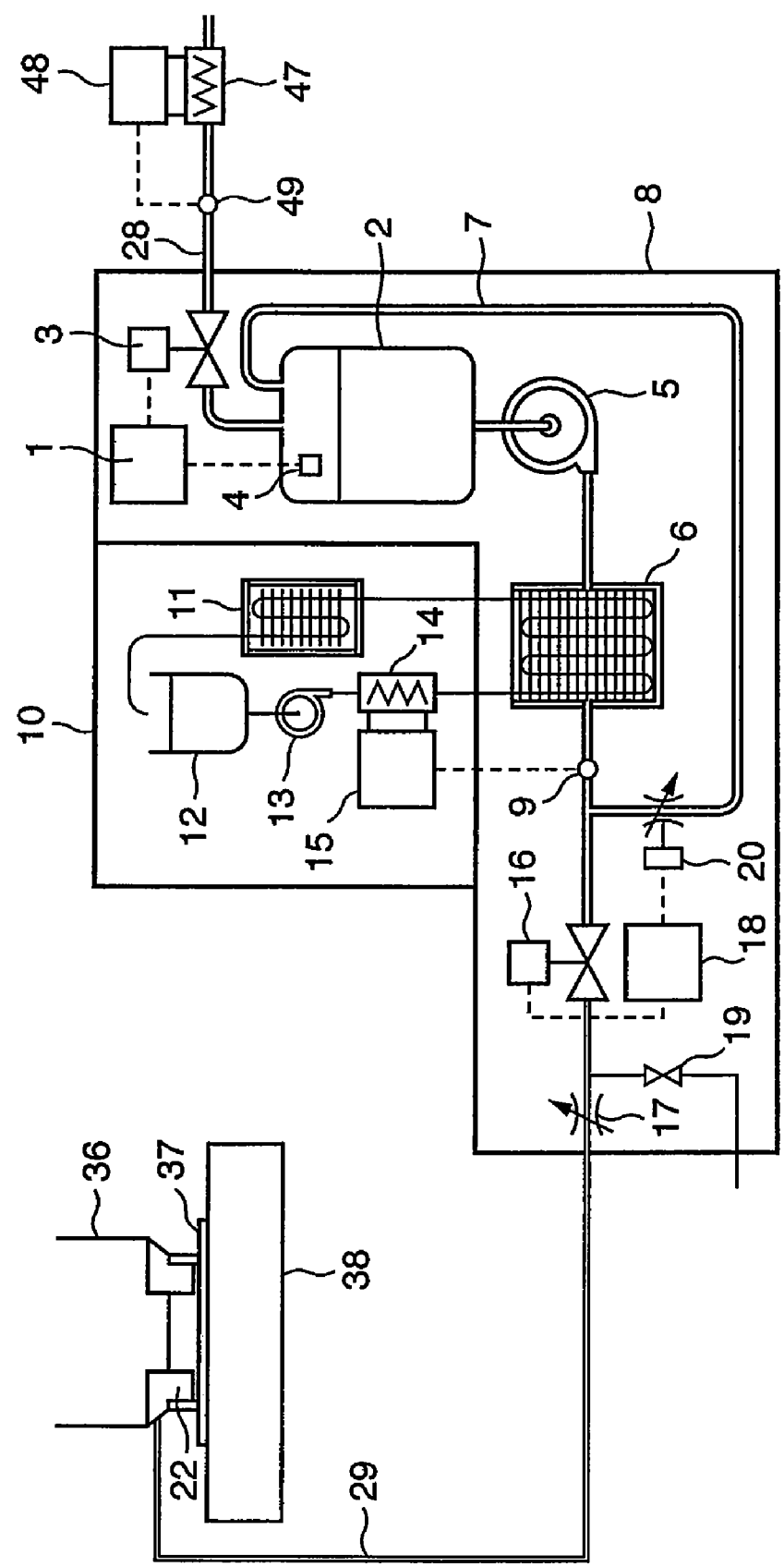
FIG. 4 is a view showing a liquid immersion fluid supply system of an exposure apparatus according to the fourth preferred embodiment of the present invention.

FIG. 4 is a view showing a liquid immersion fluid supply system of an exposure apparatus according to the fourth preferred embodiment of the present invention. Constituent elements common to those in the first embodiment in FIG. 1 are denoted by the same reference numerals.

As a characteristic feature of the fourth embodiment, a thermoregulation means is newly prepared for the liquid immersion fluid supply line 28 of the first embodiment.

More specifically, since a heater 47 is arranged upstream of a heat insulated tank 2, it is possible to thermoregulate a liquid immersion fluid provided from factory equipment. A temperature sensor 49 arranged in a downstream line of the heater 47 outputs a detection signal to a thermoregulator 48. The thermoregulator 48 then outputs a signal to the heater 47, thereby controlling the temperature of the liquid immersion fluid, such that a liquid immersion fluid in the temperature sensor 49 becomes a predetermined temperature.

According to this embodiment, a temperature disturbance applied to pure water provided from the factory equipment can be further decreased to reduce a temperature variation of an immersion liquid thermoregulation and circulation system 8. This realizes an exposure apparatus which can prevent degradation in image performance by a temperature variation and can supply a liquid immersion fluid having a constantly stable temperature.

Effects according to at least one of the first to fourth embodiments will be enumerated below. A thermoregulation and circulation system can eliminate disturbances such as a temperature variation and flow rate variation of a liquid immersion fluid provided from factory equipment, and a capacity variation at the start of supply. This makes it possible to provide an exposure apparatus which can eliminate the influence of a temperature variation of a liquid immersion fluid on optical performance, and has a stable image performance.

Even an ultra pure water thermoregulator configured to have a poor heat transfer characteristic implements high stability in temperature and flow rate, thus supplying a liquid immersion fluid to the liquid immersion portion at a high speed. Also, at the stop of liquid immersion fluid supply, the influence of corrosion can be prevented, because no liquid immersion fluid remains in the pipe. This contributes to shortening of the startup time and improvement in the throughput.

The present invention can provide an exposure apparatus which can execute liquid immersion exposure without applying any large load to factory equipment, even if pure water provided from the factory equipment is unsuitable for liquid immersion exposure.

Device Manufacturing Method

A semiconductor device manufacturing process using the exposure apparatus will be described next. FIG. 7 is a flowchart showing the flow of the overall semiconductor device manufacturing process. In step S1 (circuit design), a semiconductor device circuit is designed. In step S2 (mask fabrication), a mask is fabricated on the basis of the designed circuit pattern.

In step S3 (wafer manufacture), a wafer is manufactured using a material such as silicon. In step S4 (wafer process), called a pre process, the exposure apparatus is caused to form an actual circuit on the wafer by lithography using the mask and wafer. In step S5 (assembly), called a post process, a semiconductor chip is formed by using the wafer formed in step S4. This process includes an assembly process (dicing and bonding) and a packaging process (chip encapsulation). In step S6 (inspection), the semiconductor device manufactured in step S5 undergoes inspections such as an operation confirmation test and a durability test. After these steps, the semiconductor device is completed and shipped in step S7.

Figure 8:
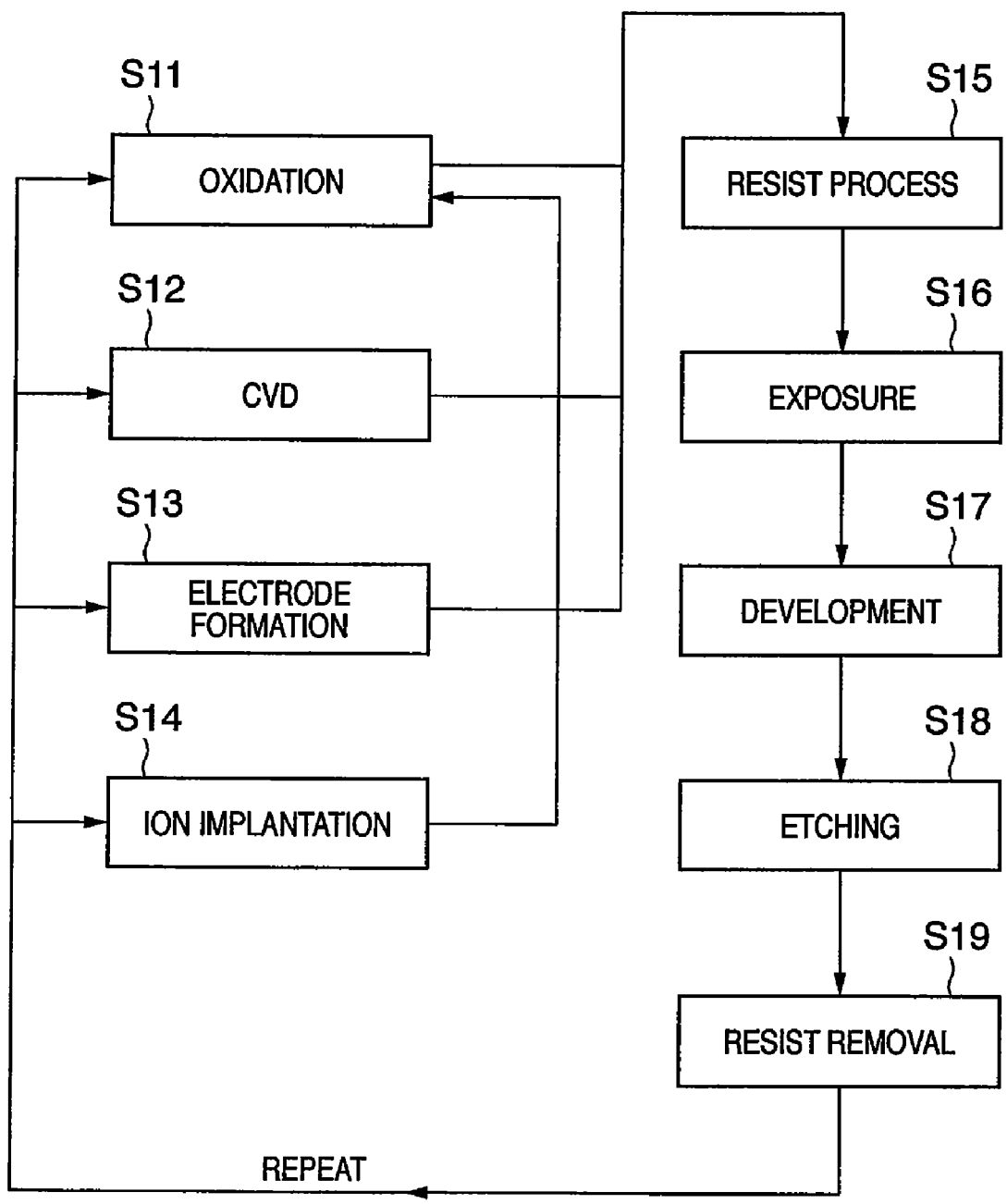
FIG. 8 is a flowchart showing the wafer process.

The wafer process in step S4 includes the following steps (FIG. 8) an oxidation step of oxidizing the wafer surface, a CVD step of forming an insulating film on the wafer surface, an electrode formation step of forming an electrode on the wafer by vapor deposition, an ion implantation step of implanting ions in the wafer, a resist processing step of applying a photosensitive agent to the wafer, an exposure step of causing the above-mentioned exposure apparatus to expose the wafer having undergone the resist processing step to form the circuit pattern, a development step of developing the wafer exposed in the exposure step, an etching step of etching the resist except for the resist image developed in the development step, and a resist removal step of removing an unnecessary etched resist. These steps are repeated to form multiple circuit patterns on the wafer.

As many apparently widely different embodiments of the present invention can be made without departing from the spirit and scope thereof, it is to be understood that the invention is not limited to the specific embodiments thereof except as defined in the appended claims.

This application claims the benefit of priority of Japanese Patent Application No. 2005-032357, filed Feb. 8, 2005, which is hereby incorporated by reference herein in its entirety.

What is claimed is:

1. An exposure apparatus configured to expose a substrate to light via a reticle, said apparatus comprising:
   a projection optical system configured to project a pattern of the reticle onto the substrate;
   a nozzle configured to supply liquid to a region, between said projection optical system and the substrate, where the light passes; and
   a circulation system configured to circulate liquid to be supplied to said nozzle, wherein said circulation system includes:
   (i) a tank configured to store an externally supplied liquid;
   (ii) a first flow path configured to supply liquid from said tank to said nozzle;
   (iii) a thermoregulator configured to thermoregulate a temperature of liquid in said first flow path; and
   iv) a second flow path configured to supply liquid to said tank from a branched point of said first flow path between said nozzle and said thermoregulator.

2. An apparatus according to claim 1, further comprising another thermoregulator, which is configured to thermoregulate liquid externally supplied to said tank.

3. An apparatus according to claim 1, wherein said thermoregulator includes a heat exchanger configured to exchange heat with the liquid.

4. An apparatus according to claim 3, wherein said thermoregulator includes a heater configured to heat liquid downstream of said heat exchanger.

5. An apparatus according to claim 4, further comprising:
   a detector configured to detect an amount of liquid in said tank; and
   a flow regulator configured to regulate a flow rate of liquid externally supplied to said tank based on detection performed by said detector.

6. An apparatus according to claim 5, wherein said circulation system further comprises a valve arranged between said nozzle and the branched point configured to supply liquid from said circulation system to said nozzle.

7. An apparatus according to claim 6, wherein said circulation system includes another flow regulator, which is configured to regulate a flow rate of liquid flowing in said second flow path refluxed to said tank.

8. An apparatus according to claim 6, further comprising:
   a second flow path arranged between said valve and said nozzle; and
   another flow regulator, which is configured to regulate a flow rate of liquid in said first second flow path between said valve and said nozzle.

9. An apparatus according to claim 6, further comprising:
   another flow path, which is arranged between said valve and said nozzle; and
   a gas supply unit system configured to supply gas into at least one of said first flow path and the other flow path between said valve and said nozzle.

10. An apparatus according to claim 1, wherein said circulation system includes at least one of an ion exchanger configured to remove an ion dissolved in liquid, a degassifier, configured to degasify liquid, and a sterilizer configured to sterilize liquid.

11. An apparatus according to claim 1, wherein said first flow path includes a flow path which is wound around an external cylinder of a flow path of said circulation system and has a portion configured to exchange heat with said projection optical system.

12. A method of manufacturing a device, said method comprising steps of:
    exposing a substrate to light via a reticle using an exposure apparatus as defined in claim 1;
    developing the exposed substrate; and
    processing the developed substrate to manufacture the device.

* * * * *